(12) United States Patent
Mathews (10) Patent No.: US 6,304,676 B1
(45) Date of Patent: Oct. 16, 2001

(54) APPARATUS AND METHOD FOR SUCCESSIVELY REFINED COMPETITIVE COMPRESSION WITH REDUNDANT DECOMPRESSION

(76) Inventor: Mark A. Mathews, 1131 Lynbrook Way, San Jose, CA (US) 95129

( * ) Notice: Subject to any disclaimer, the term of this patent is extended or adjusted under 35 U.S.C. 154(b) by 0 days.

(21) Appl. No.: 08/944,199

(22) Filed: Oct. 3, 1997

Related U.S. Application Data (60) Provisional application No. 60/027,592, filed on Oct. 3, 1996.

(51) Int. Cl.[7] .................................................. G06K 9/36
(52) U.S. Cl. ............................................ 382/246; 382/244
(58) Field of Search ............................... 358/427, 261.1, 358/426, 261.3, 261.2; 395/114; 382/246, 244, 232, 233; 341/95

(56) References Cited

U.S. PATENT DOCUMENTS

| | | | |
|---|---|---|---|
| 4,814,746 | 3/1989 | Miller et al. | 341/95 |
| 4,899,148 | * 2/1990 | Sato et al. | 358/261.3 |
| 5,049,881 | 9/1991 | Gibson et al. | 341/95 |
| 5,825,830 | * 10/1998 | Kopf | 382/246 |
| 5,848,195 | * 12/1998 | Romriell | 382/246 |

* cited by examiner

Primary Examiner—Cheukfan Lee
(74) Attorney, Agent, or Firm—Wilson Sonsini Goodrich & Rosati (57) ABSTRACT

System and method using a competitive process to create an optimized set of variable length bit codes to encode one, two or three dimensional data and a high speed redundant lookup table for decoding the resulting representation in real time. The encoding phase consists of multiple passes through the unencoded data to determine the overall best code set for the given data. The primitives used to encode the data may be any mix of operations that captures the redundancy of the raw data. For graphic applications, specific colors and patterns copied from previously occurring data yield sufficiently high compression ratios, but any likely candidates for high frequency occurrence may be added to the mix. The encoding algorithm will ignore any non-optimal operations and assign them no space in the code set. The decoding phase takes the code set generated by the encoding phase and builds one or more redundant lookup tables, where each code's entry occurs a sufficient number of times to guarantee that a single lookup using the next n bits of the encoded data stream as index will correctly decode the next code in the stream.

22 Claims, 5 Drawing Sheets

Microfiche Appendix Included
(2 Microfiche, 104 Pages)

FIGURE 5

APPARATUS AND METHOD FOR SUCCESSIVELY REFINED COMPETITIVE COMPRESSION WITH REDUNDANT DECOMPRESSION

REFERENCE TO RELATED APPLICATION

This application claims the benefit of provisional application No. 60/027,592 filed on Oct. 3, 1996. Provisional application No. 60/027,592 is hereby incorporated herein by reference in its entirety.

BACKGROUND

This disclosure includes a microfiche appendix. The microfiche appendix includes a total number of 2 fiche and a total number of 104 frames.

COPYRIGHT AUTHORIZATION

A portion of the disclosure of this patent document contains material which is subject to copyright protection. The copyright owner has no objection to the facsimile reproduction by any one of the patent disclosure, as it appears in the U.S. Pat. and Trademark Office patent files or records, but otherwise reserves all copyright rights whatsoever.

1. Field of the Invention

The field of the present invention relates in general to a apparatus and method for data processing. More particularly, the field of the invention relates to an apparatus and method for compression and decompression of data for transmission or storage.

2. Background

A wide variety of methods exist for compressing and decompressing data. Such data generally comprise primitives called characters which represent specific data values. The finite set of primitives constitutes a character set which may also be referred to as an alphabet. For instance, in the ASCII character set, the primitive character "01000110" represents the letter "F". A string is a sequence of characters within a given character set. A string may be compressed by identifying substrings or characters that appear repetitively. These repetitive substrings or characters may then be replaced with codes based on the frequency of their occurrence within the string. The substrings and characters with the highest frequency may be assigned the shortest codes. A code table (which may take the form of a table, tree, linked list or other data structure) containing the compression codes and the corresponding uncompressed characters and substrings may be stored or sent with the compressed string to allow decompression.

One common method for general purpose data compression is the Huffinan method. The Huffman method involves mapping fixed length substrings into variable length codes based on the frequency of their occurrence. The code table may take the form of a tree, where the codes can be used to traverse the tree and the characters corresponding to the codes are located in leaves of the tree. The characters with the highest frequency and shortest codes are located in higher levels of the tree. However, when a large number of nodes are included within the tree, the overhead required for traversing the tree grows correspondingly.

While a wide variety of compression/decompression methods have been developed, a need exists for improved methods. For instance, increasingly higher rates of compression and faster decompression are desirable for use with the World Wide Web. The large amount of data stored on servers and the low transmission rates for many clients makes it desirable to optimally compress data for storage and transmission. In addition, it is important that the data be decompressed quickly by the client computer to allow immediate viewing or use by the end user, It should be noted that, since most data is compressed and stored on network servers in advance, slower compression techniques with higher compression rates may be used. Such techniques, however, should allow for fast decompression as described above.

SUMMARY OF THE INVENTION

Aspects of the present invention use a competitive process to create an optimized set of variable length bit codes to encode one, two or three dimensional data and a high speed redundant lookup table for decoding the resulting representation in real time.

One aspect of the present invention provides an improved apparatus and method for compressing strings for storage or transmission. In one exemplary embodiment, a computer program executing on a general purpose computer may be used to compress an incoming string. The computer program makes multiple passes through the unencoded string to determine an overall best code set for the given string. The computer program may use multiple coding techniques to analyze the string. During the first pass, the computer program simply enumerates all possible encodings of the data by the coding primitives implemented and creates a Huffinan encoding for the set as if each code were actually used at each possible location. For instance, one set of codes may be assigned based on the frequency of each character in the string. A second set of codes may be assigned based on the number of times that characters or substrings are repeated at certain offsets within the string (e.g. the number of times that the current character or substring is the same as a character or substring that is located previously in the string at a particular offset). Subsequent passes make trial encodings of the data using the shortest codes available from the various code sets and count the number of times each code was actually used, then recalculate the Huffman codes for the relative actual frequencies of the codes used (discarding codes from the code sets that are not used). The trial encoding and recalculation continues until specific criteria are met or the data is not further compressed. A final pass compresses the data using the best code set found and writes it to the output as either a disk file or an evanescent transmission.

Another aspect of the present invention provides an improved apparatus and method for decompressing compressed strings. In one exemplary embodiment, a computer program executing on a general purpose computer processes the code set generated by the encoding phase and builds one or more redundant lookup tables, where each code's entry occurs a sufficient number of times to guarantee that a single lookup using the next n bits of the encoded data stream as index will correctly decode the next code in the stream. This table is then used to interpret the codes in the data stream and exactly reproduce the original data.

The primitives used to encode the data may be any mix of operations that captures the redundancy of the raw data. For graphic applications, specific colors and patterns copied from previously occurring data yield sufficiently high compression ratios, but any likely candidates for high frequency occurrence may be added to the mix. The encoding algorithm will ignore any non-optimal operations and assign them no space in the code set.

DESCRIPTION

One aspect of the present invention provides a novel apparatus and method for a compression and/or decompression of strings for storage and/or transmission. The following description is presented to enable any person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1A:
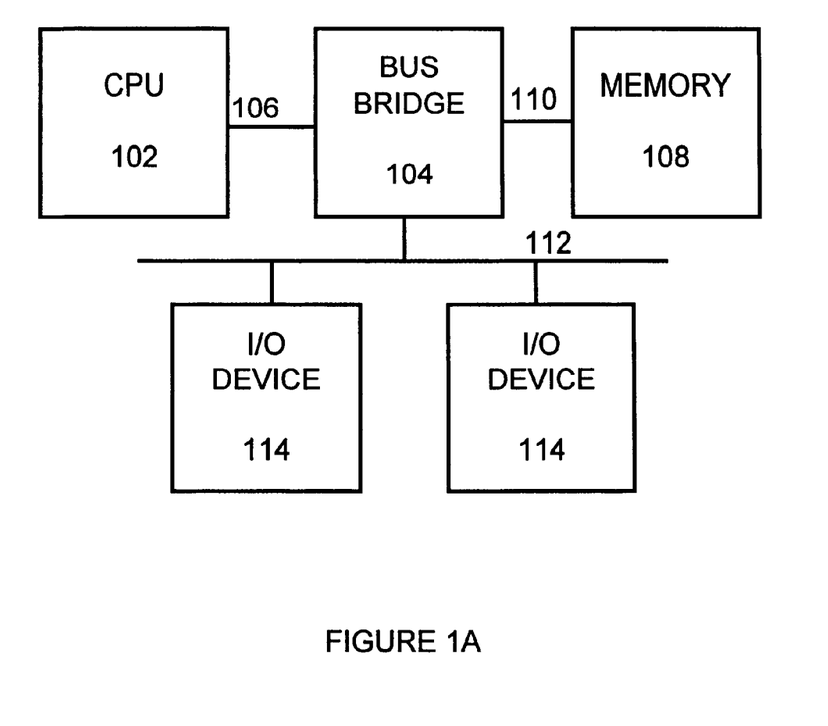
FIG. 1A shows one of several common architectures for a system on which an embodiment of the present invention may be executed.

A first embodiment of the present invention provides a compressor and decompressor that are each executable on a general purpose programmable computer system. Examples of such computer systems include IBM compatible personal computer systems running the DOS or Microsoft Windows operating systems, workstations running a version of the UNIX operating system and the Apple Macintosh computer system running the Apple Macintosh operating system. FIG. 1A shows one of several common architectures for such a system. Referring to FIG. 1A, such computer systems may include a central processing unit (CPU) 102 for executing instructions and performing calculations, a bus bridge 104 coupled to the CPU 102 by a local bus 106, a memory 108 for storing data and instructions coupled to the bus bridge 104 by memory bus 110, an input/output (I/O) bus 112 coupled to the bus bridge 104, and I/O devices 114 coupled to the I/O bus 112. As is known in the art, the various buses provide for communication among system components. The I/O devices 114 preferably include a manually operated keyboard and a mouse or other selecting device for input, a CRT or other computer display monitor for output and a disk drive or other storage device for non-volatile storage of data and program instructions. As is known in the art, some or all of the input/output devices may be local I/O devices which may be attached to the local bus 106 instead of the I/O bus 112. The operating system typically controls these components and provides a user interface. The user interface is preferably a graphical user interface which includes windows and menus that may be controlled by the keyboard or selecting device. Of course, as will be readily apparent to one of ordinary skill in the art, other computer systems and architectures are readily adapted for use with embodiments of the present invention.

The computer programs used in the first embodiment reside on storage media or in memory 108 and are provided to CPU 102 for execution. The uncompressed and compressed strings may reside in memory 108, on storage media or be transmitted to or from other I/O devices 114.

Figure 1B:
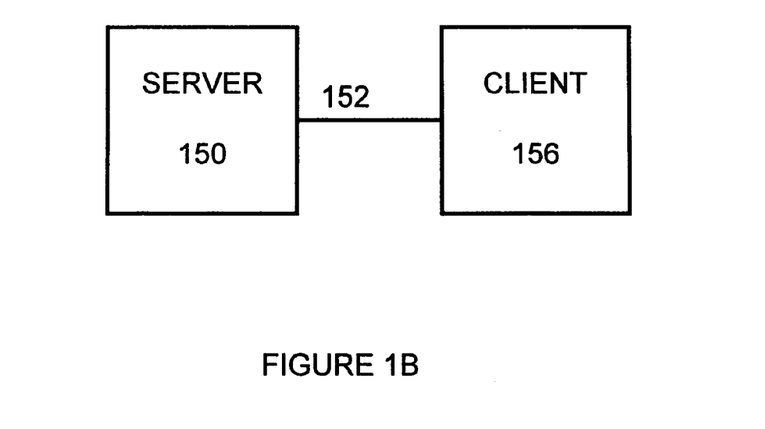
FIG. 1B shows how computers may be connected through transmission lines as part of a computer network for use in conjunction with embodiments of the present invention.

As shown in FIG. 1B, computer systems 150 and 156 may be connected through transmission lines 152 as part of a computer network for use in conjunction with embodiments of the present invention. In particular, such the computer systems may be arranged in a client/server configuration where the server 150 provides data requested by the client 156. In an exemplary embodiment, a computer program for compressing data according to an embodiment of the present invention may reside on the server to compress data. When the data is requested by the client, it may be transmitted in compressed form. A computer program for decompressing data according to an embodiment of the present invention may reside on the client to decompress the data as it is received. Such a configuration may be used for providing compressed data from web pages on the world wide web or other networked systems. Of course, it will be readily apparent that a wide variety of network configurations may be used in conjunction with embodiments of the present invention.

The operation of a computer system for compression and decompression according to an exemplary embodiment of the present invention is illustrated in a computer program listing for a sample encoder/decoder included at the end of this specification. The computer program listing in Appendix A in the microfiche appendix and is incorporated herein by reference.

In a first embodiment of the present invention compression is accomplished by traversing a string and encoding the string using multiple coding techniques. The string may be buffered in memory 108 and traversed by CPU 102 multiple times in accordance with computer program instructions according to an embodiment of the present invention. For each coding technique, the CPU 102 determines the frequency that the characters, substrings or patterns represented by the code are used in the string and stores this information in a table or other data structure in memory 108. For instance, CPU 102 may first determine the frequency of each character in the string and store this information in a first table in memory 108. Next CPU 102 may reprocess the string to determine the frequency at which characters or substrings are repeated throughout the string at a given offset. For instance, the number of times that the same character or substring is repeated at an offset of five characters apart may be calculated. For this coding technique, the offset, length of characters repeated, and frequency of that occurrence is stored in a table in memory 108. Then an overall preliminary code set may be assigned to the string based on the frequency of events in the two tables. CPU 102 may then encode the string by choosing, for each character or substring, whether it is more efficient to use a code in the table from the first coding technique (based in character frequency) or from the second coding technique (based on frequency that characters are repeated at a given offset in the string). CPU 102 then discards codes that were not used and reassigns codes only to those that were used using only the shortest codes available. A final code table is generated using those codes. In this way, two coding techniques are competitively combined for improved compression. In the same manner, additional coding techniques based on the frequency of any variety of patterns in the storing may be included as part of the compression method according to embodiments of the present invention. This encoding process will now be described in further detail.

The encoding phase is accomplished by calling the compression subroutine with one or more data files to be compressed and such parameters as are necessary to control the subroutine's operation. The compression subroutine makes multiple passes over all the data and determines the optimal code set for the primitives available, encodes the data and passes back the code set with the encoded data for each input file. The code set may then be used to decode any or all of the encoded data files.

The first pass enumerates all possible encodings at all possible positions over all the input data files. Statistics are kept on frequency of use of each data item value, total count of possible uses of copied data from the current line, precedent lines, or precedent frames for three dimensional data, runs of repeated values and runs of special purpose functions such as background, darken and lighten. Once these initial statistics are collected, Huffman's algorithm is used to created an optimal code set for the given frequencies of use of the various primitives.

A trial encoding then is made where the data is scanned for all possible encodings and that code which yields the highest compression ratio is selected at each position. The encoded data is discarded during trial encodings and only the actual number of times each specific primitive was selected is retained. The new statistics are used to generate a more refined code set and the process may be repeated until the increase in compression is insufficient to warrant further effort or a decrease in compression is detected.

The final encoding pass uses the best code set found to encode all data files for subsequent output. The code set is returned to the caller as a list of bit codes and their interpretations, along with the encodings corresponding to each data file.

The code set is limited to a specific length such as 8 or 32 bits to simplify the implementation of the decoding process. Since Huffman's method produces bit codes whose lengths are optimal and inversely proportional to their frequency of use, rarely used primitives can produce exceptionally long codes. To prevent the occurrence of codes longer than the maximum code length, generic codes are introduced for each primitive that allow the parameters of the primitive such as colour index, offset to source and/or run length to be appended to the bit code for the generic form of the primitive, where the extra bits are skipped by the decoder. This allows any code exceeding the maximum code length to be discarded unless it is one of the generic codes which are promoted (moved up the tree) until they are within the maximum code length.

The promotions are accomplished by a recursive subroutine which walks the tree of codes and whose return value indicates if the subtree under scrutiny must be promoted to maintain the maximum code length. For a terminal leaf, it examines the code to see if it is a required generic code and returns a 'must promote' result if the code can not be discarded. When the subroutine encounters subtrees as opposed to a terminal leaf, it calls itself once for both subtrees. If one but not both of the subtrees must be promoted then the promoted subtree is moved up and the other is discarded. If both subtrees must be promoted then the routine returns the 'must promote' result and the subtree containing both the required subtrees is promoted at a higher level.

As a minimal but fully functional example, consider the case where the code length is limited to 4 bits, the unencoded data is a stream of eight bit ASCII characters and the encoding primitives are an operation to insert a single character and an operation to copy from one to eight characters from a position from one to thirty-two positions back from the current output position. Given an example message of 'The quick brown rabbit quietly bit it's own back paw' we can build the following tables showing the frequency of possible uses of each operation.

Table 1 below shows the frequency of characters in the string. The column entitled "Count" contains the number of times that a character appears in the string, and the column entitled "Value" indicates the data item corresponding to that character. If this coding technique were used alone, the shortest codes would be assigned to the most frequent characters. Then to decode the string, the character would simply be inserted each time its code was encountered.

TABLE 1

| Count | Value |
|---|---|
| 9 | <space> |
| 5 | b |
| 5 | i |
| 4 | t |
| 3 | a |
| 3 | w |
| 2 | c |
| 2 | e |
| 2 | k |
| 2 | n |
| 2 | o |
| 2 | q |
| 2 | r |
| 2 | u |
| 1 | <quote> |
| 1 | <period> |
| 1 | T |
| 1 | h |
| 1 | l |
| 1 | p |
| 1 | s |
| 1 | y |

Table 2 below shows the frequency that a substring of a given length is repeated in the string at a given offset. The column entitled "Position" shows the offset, the column entitled "Length" shows the length of the substring, and the column entitled "Count" shows the number of times that a substring with the given length is repeated in the string at the given offset. For instance, the first column indicates that there are five occurrences in the string where a character (i.e.,a substring with a length of one) is the same as a character that appeared earlier (i.e., an offset/position of five). If this coding technique were used alone, the shortest codes would be assigned to the most frequent occurrences where a given length substring is repeated at a given offset. Then to decode the string when a code was encountered, the computer program would replace the code with a substring of the given length. The substring would be copied from a buffer containing the characters in the string that had already been decoded. The offset/position would be used to determine how far back (i.e., the number of characters) in the buffer the desired substring can be found.

TABLE 2

| Count | Position | Length |
|---|---|---|
| 5 | 5 | 1 |
| 5 | 9 | 1 |
| 5 | 12 | 1 |
| 5 | 19 | 1 |

TABLE 2-continued

| Count | Position | Length |
|---|---|---|
| 5 | 28 | 1 |
| 4 | 6 | 1 |
| 4 | 13 | 1 |
| 3 | 12 | 2 |
| 3 | 19 | 2 |
| 3 | 28 | 2 |
| 3 | 15 | 1 |
| 3 | 21 | 1 |
| 3 | 26 | 1 |
| 2 | 12 | 3 |
| 2 | 19 | 3 |
| 2 | 28 | 3 |
| 2 | 3 | 1 |
| 2 | 4 | 1 |
| 2 | 7 | 1 |
| 2 | 8 | 1 |
| 2 | 10 | 1 |
| 2 | 4 | 1 |
| 2 | 24 | 1 |
| 2 | 25 | 1 |
| 1 | 12 | 4 |
| 1 | 19 | 4 |
| 1 | 28 | 4 |
| 1 | 3 | 2 |
| 1 | 13 | 2 |
| 1 | 15 | 2 |
| 1 | 21 | 2 |
| 1 | 1 | 1 |
| 1 | 17 | 1 |
| 1 | 18 | 1 |
| 1 | 27 | 1 |
| 1 | 29 | 1 |
| 1 | 30 | 1 |
| 1 | 31 | 1 |

The computer program according to the first embodiment, however, does not use either coding technique alone. Rather, the two tables are combined to generate an optimum Huffman code set for the given possible usage counts. The most frequently used character or offset/length has been assigned the shortest code and all others assigned codes whose lengths are inversely proportional to their counts as shown in Table 3 below.

TABLE 3

| Code | Count | Function | Value/Position | Length |
|---|---|---|---|---|
| 00000 | 3 | Copy | 26 | 1 |
| 00001 | 3 | Copy | 21 | 1 |
| 00010 | 4 | Copy | 6 | 1 |
| 00011 | 4 | Insert | t | |
| 001000 | 2 | Insert | q | |
| 001001 | 2 | Insert | o | |
| 001010 | 2 | Insert | u | |
| 001011 | 2 | Insert | r | |
| 001100 | 2 | Insert | e | |
| 001101 | 2 | Insert | c | |
| 001110 | 2 | Insert | n | |
| 001111 | 2 | Insert | k | |
| 010000 | 2 | Copy | 7 | 1 |
| 010001 | 2 | Copy | 4 | 1 |
| 010010 | 2 | Copy | 10 | 1 |
| 010011 | 2 | Copy | 8 | 1 |
| 010100 | 2 | Copy | 19 | 3 |
| 010101 | 2 | Copy | 12 | 3 |
| 010110 | 2 | Copy | 3 | 1 |
| 010111 | 2 | Copy | 28 | 3 |
| 0110000 | 1 | Copy | 18 | 1 |
| 0110001 | 1 | Copy | 17 | 1 |
| 0110010 | 1 | Copy | 29 | 1 |
| 0110011 | 1 | Copy | 27 | 1 |
| 0110100 | 1 | Copy | 15 | 2 |
| 0110101 | 1 | Copy | 13 | 2 |
| 0110110 | 1 | Copy | 1 | 1 |
| 0110111 | 1 | Copy | 21 | 2 |
| 011100 | 2 | Copy | 24 | 1 |
| 011101 | 2 | Copy | 14 | 1 |
| 0111100 | 1 | Copy | 31 | 1 |
| 0111101 | 1 | Copy | 30 | 1 |
| 011111 | 2 | Copy | 25 | 1 |
| 1000000 | 1 | Insert | <period> | |
| 1000001 | 1 | Insert | <quote> | |
| 1000010 | 1 | Insert | h | |
| 1000011 | 1 | Insert | T | |
| 10001 | 4 | Copy | 13 | 1 |
| 1001000 | 1 | Copy | 19 | 4 |
| 1001001 | 1 | Copy | 12 | 4 |
| 1001010 | 1 | Copy | 3 | 2 |
| 1001011 | 1 | Copy | 28 | 4 |
| 1001100 | 1 | Insert | p | |
| 1001101 | 1 | Insert | l | |
| 1001110 | 1 | Insert | y | |
| 1001111 | 1 | Insert | s | |
| 1010 | 9 | Insert | <space> | |
| 10110 | 5 | Copy | 5 | 1 |
| 10111 | 5 | Insert | i | |
| 11000 | 5 | Copy | 12 | 1 |
| 11001 | 5 | Copy | 9 | 1 |
| 11010 | 5 | Copy | 28 | 1 |
| 11011 | 5 | Copy | 19 | 1 |
| 11100 | 5 | Insert | b | |
| 111010 | 3 | Insert | w | |
| 111011 | 3 | Insert | a | |
| 111100 | 3 | Copy | 19 | 2 |
| 111101 | 3 | Copy | 12 | 2 |
| 111110 | 3 | Copy | 15 | 1 |
| 111111 | 3 | Copy | 28 | 2 |

Using table 3, the computer program according to the first embodiment then makes a trial encoding of the message. Wherever there are two possible ways to encode a character or string of characters CPU 102 selects the encoding that has the highest ratio of input to output bits. The encoding selected for 'The quick brown rabbit quietly bit it's own back paw.' using the above exemplary techniques is shown in Table 4 below.

TABLE 4

| Character(s) | Code | Function | Reason |
|---|---|---|---|
| T | 1000011 | Insert 'T' | No other choice |
| h | 1000010 | Insert 'h' | No other choice |
| e | 001100 | Insert 'e' | No other choice |
| <space> | 1010 | Insert <space> | No other choice |
| q | 001000 | Insert 'q' | No other choice |
| u | 001010 | Insert 'u' | No other choice |
| i | 10111 | Insert 'i' | No other choice |
| c | 001101 | Insert 'c' | No other choice |
| k | 001111 | Insert 'k' | No other choice |
| <space> | 1010 | Insert <space> | Shorter than 00010 - Copy 1 from 6 back |
| b | 11100 | Insert 'b' | No other choice |
| r | 001011 | Insert 'r' | No other choice |
| o | 001001 | Insert 'o' | No other choice |
| w | 111010 | Insert 'w' | No other choice |
| n | 001110 | Insert 'n' | No other choice |
| <space> | 1010 | Insert <space> | Shorter than 00010 - Copy 1 from 6 back |
| r | 10110 | Copy 1 from 5 back | Shorter than 001011 - Insert 'r' |
| a | 111011 | Insert 'a' | No other choice |
| b | 11100 | Insert 'b' | Shorter than 010011 - Copy 1 from 6 back |

TABLE 4-continued

| Character(s) | Code | Function | Reason |
|---|---|---|---|
| b | 11100 | Insert 'b' | Shorter than 0110110 - Copy 1 from 6 back |
| i | 10111 | Insert 'i' | Shorter than 011101 - Copy 1 from 14 back |
| t | 00011 | Insert 't' | No other choice |
| <space> | 1010 | Insert <space> | Shorter than 010000 - Copy 1 from 7 back |
| qui | 010100 | Copy 3 from 19 back | Shorter than codes for 'q', 'u', 'i' |
| e | 011100 | Copy 1 from 24 back | More general than 001100 - Insert 'e' |
| t | 00011 | Insert 't' | Shorter than 0110110 - Copy 1 from 6 back |
| l | 1001101 | Insert 'l' | No other choice |
| y | 1001110 | Insert 'y' | No other choice |
| <space> | 1010 | Insert <space> | Shorter than 010011 - Copy 1 from 8 back |
| bit<space> | 1001001 | Copy 4 from 12 back | Shorter than codes for 'b', 'i', 't', <space> |
| it | 1001010 | Copy 2 from 3 back | Shorter than codes for 'i', 't' |
| <quote> | 1000001 | Insert <quote> | No other choice |
| s | 1001111 | Insert 's' | No other choice |
| <space> | 1010 | Insert <space> | Shorter than 10110 - Copy 1 from 5 back |
| own<space> | 1001011 | Copy 4 from 28 back | Shorter than codes for 'o', 'w', 'n', <space> |
| b | 10001 | Copy 1 from 13 back | More general than 11100 - Insert 'b' |
| a | 11010 | Copy 1 from 28 back | Shorter than 111011 - Insert 'a' |
| c | 001101 | Insert 'c' | No other choice |
| k | 001111 | Insert 'k' | No other choice |
| <space> | 1010 | Insert <space> | Shorter than 010001 - Copy 1 from 4 back |
| p | 1001100 | Insert 'p' | No other choice |
| a | 10110 | Copy 1 from 5 back | Shorter than 111011 - Insert 'a' |
| w | 010010 | Copy 1 from 10 back | More general than 111010 - Insert 'w' |
| <period> | 1000000 | Insert <period> | No other choice |

Having made a trial encoding, the exemplary computer program then discards any codes that were not used and rebuilds the Huffman codes according to the actual number of times each code was used. Many specific operations that were possible were not in fact used, since they were not the shortest encoding, so they are deleted from subsequence code sets. The final codes and a final code table are then used to compress the string.

The compressed string may then be transmitted over a network or stored on a storage device. The compressed string may then be processed by a computer program implementing a decompression method according to the first embodiment to reconstruct the original string. Such computer program accomplishes decoding by constructing a lookup table in memory 108 from the code table (which is stored and/or transmitted with the compressed string) and then interpreting each code in the compressed string by direct lookup of the prefix of the stream. The computer program places the same decoding parameters in all of the table entries whose indices begin with a specific code such that a direct lookup will yield the correct result no matter what code succeeds the current one.

For instance, utilizing an 8 bit maximum code length, a 256 entry table may be constructed by CPU 102 such that all possible 8 bit prefixes to the encoded data are made to correspond to the appropriate decoding operations which greatly reduces the time required for decoding. A 32 bit maximum code length may be used to avoid the speed degradation required to handle longer quantities on small computer systems. The lookup table for 32 bit codes will typically be constructed with from 4096 to 65536 entries and will contain both directly decoded entries for codes whose width does not exceed the index width of the table and pointers to lists of entries for codes that do exceed the index width. Note that while the maximum code width is enforced by the encoder routine, the construction and details of the decoding table are left up to the decoder routine.

As an example, for a given code $10110_2$ in an eight bit limited coding scheme each index of the form $10110XXX_2$ is generated and all the corresponding entries are set to the primitive function and parameters for the $10110_2$ code. Thus the entries at locations $10110000_2$ (176) through $10110111_2$ (183) are all set to the interpretation of $10110_2$. The same code in a 32 bit limited scheme with a twelve bit decoding table would result in all entries indexed by $10110XXXXXXX_2$ ($101100000000_2$ through $101101111111_2$) being set to the same primitive function and parameters, namely those of the $10110_2$ code.

When the index to the decoder table is wide enough and the codes under consideration are short enough, then it is possible to make the decoder accept two or more codes at a time whenever the concatenation of the codes does not exceed the index width. This allows the decoder to avoid the decoding cycle for the second and subsequent concatenated codes for a corresponding decrease in decoding time. For example, if $110_2$ and $1110_2$ are both codes in an eight bit coding scheme, then entries $1101110X_2$ would decode to the operation for $110_2$ followed by the operation for $1110_2$ and entries of indexed by $1110110X_2$ would decode to the same pair of operations in reversed order. All other entries of the form $110XXXXX_2$ and $1110XXXX_2$ would decode to the single operations for $110_2$ and $1110_2$ respectively.

Figure 2:
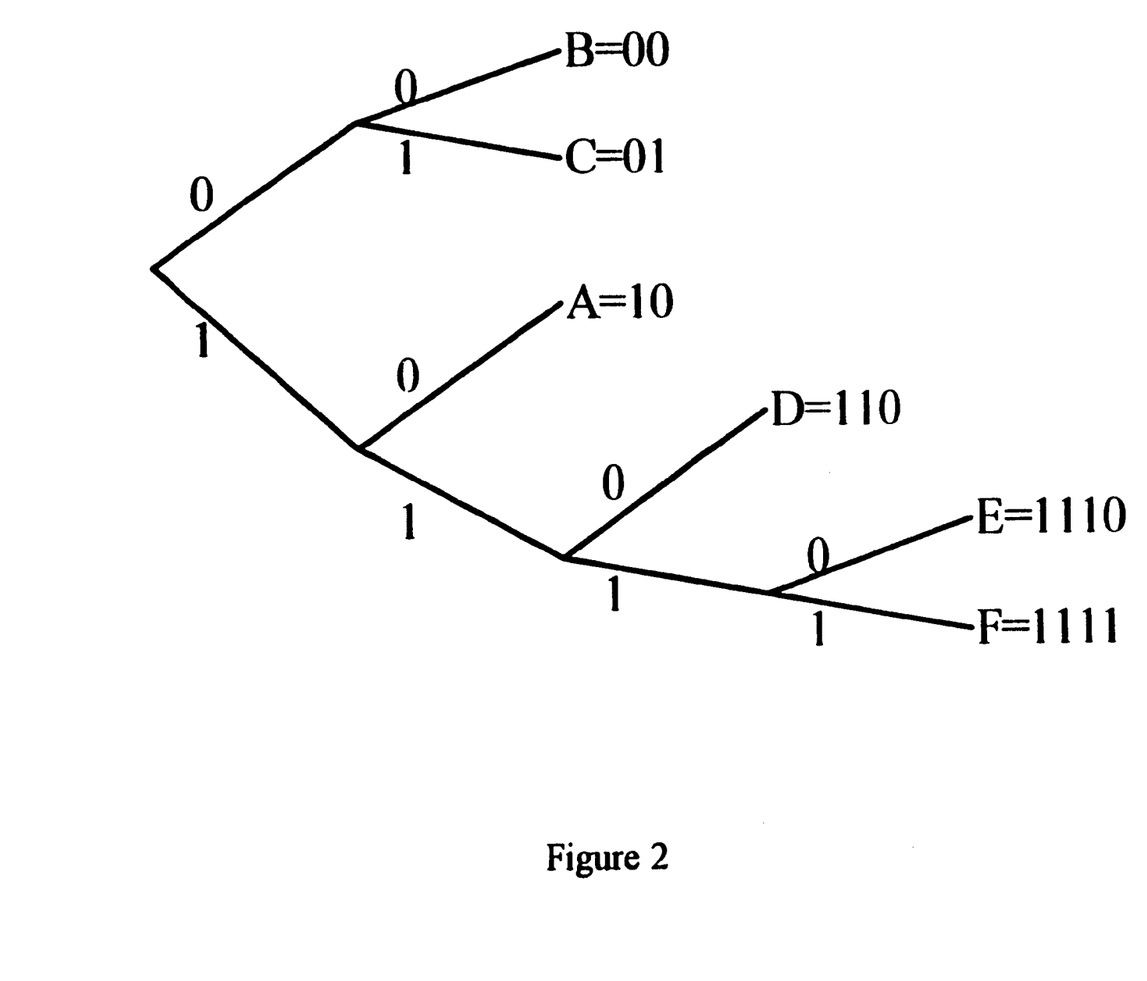
FIG. 2 shows a Huffman tree corresponding to an exemplary message consisting of specific ASCII characters processed in accordance with an embodiment of the present invention.

As a greatly simplified illustration, consider the following. Given a message consisting of the ASCII characters 'ADFBAAABCCAAAABBBCCDDEEE' the respective frequencies for each character are as given in Table 5 below. The corresponding Huffman tree is shown in FIG. 2.

TABLE 5

| Value | Count | Code |
|---|---|---|
| A | 8 | 10 |
| B | 5 | 00 |
| C | 4 | 01 |
| D | 3 | 110 |
| E | 3 | 1110 |
| F | 1 | 1111 |

The compressed string then becomes:

'10110111100101010000101101010100000000101110110-111011101110.' Using a four bit coding scheme there would be sixteen entries whose values would be as specified in Table 6. Thus when decoding the first four bits of the message '1011' are used as an index into the table which yields a value of 'A' and a length of two. The first two bits are then discarded and the next four undiscarded bits of the message are then used as the new index, namely '1101' which yields a value of 'D' and a length of three. After the discarding the three bits used by the code for 'D', the next four bits are '1111' which yields 'F' and a length of four.

TABLE 6

| Index | Value | Length |
|---|---|---|
| 0000 | B | 2 |
| 0001 | B | 2 |
| 0010 | B | 2 |
| 0011 | B | 2 |
| 0100 | C | 2 |
| 0101 | C | 2 |
| 0110 | C | 2 |
| 0111 | C | 2 |
| 1000 | A | 2 |
| 1001 | A | 2 |
| 1010 | A | 2 |
| 1011 | A | 2 |
| 1100 | D | 3 |
| 1101 | D | 3 |
| 1110 | E | 4 |
| 1111 | F | 4 |

The increase in execution speed by using the direct redundant lookup table cannot be overstressed. The standard way of interpreting Huffman or other binary tree composed codes is by examining each bit of the message in sequence and tracing the tree representation until a terminal node is found. Even in this greatly simplified example it can be seen that many more operations are required to trace the tree than to lookup the prefix in the table. When the number of nodes grows into the thousands, the overhead to trace the tree grows correspondingly, while the direct table lookup essentially does not change. To implement more codes in the direct lookup, a wider index is used and a correspondingly larger table.

Figure 3:
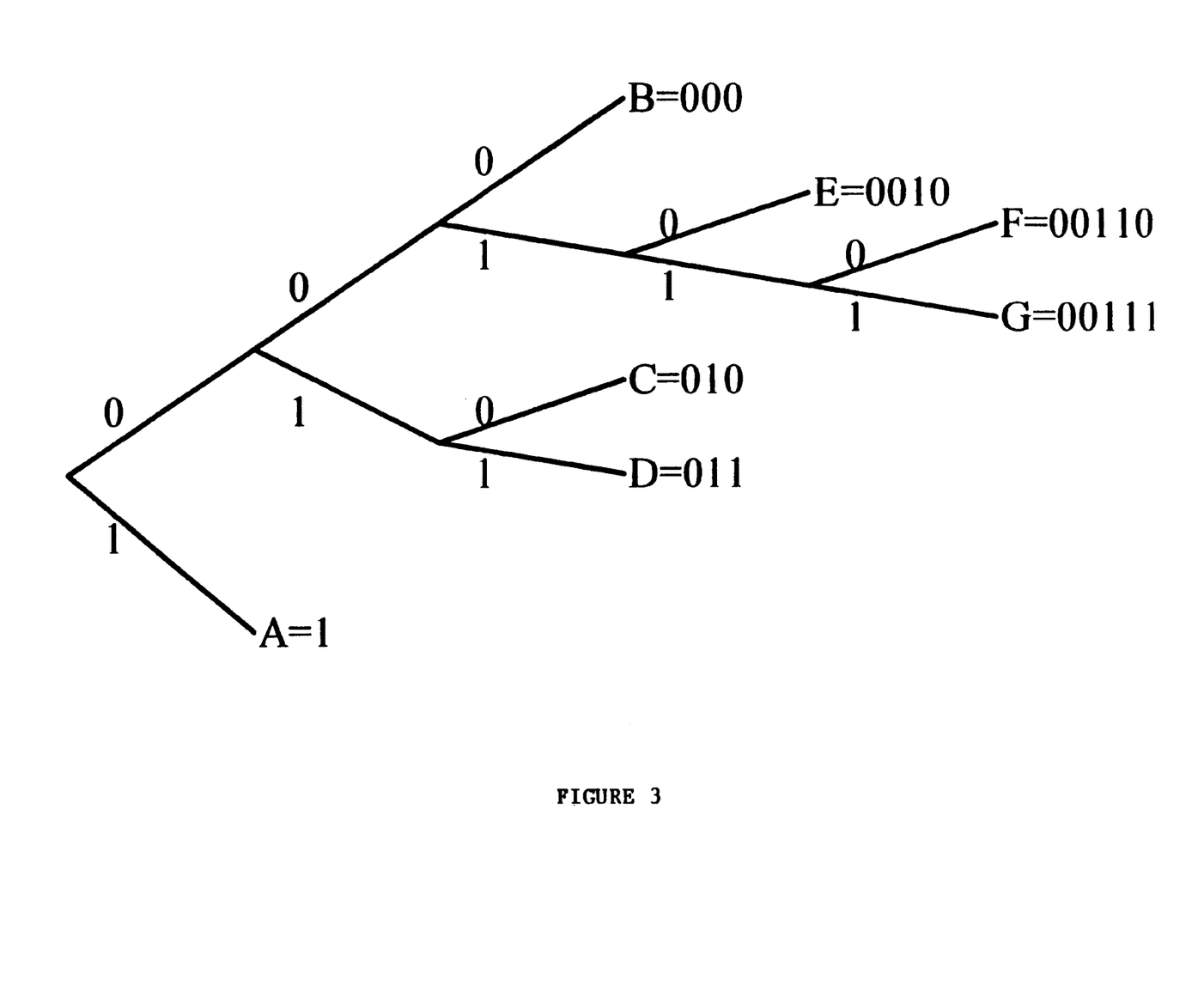
FIG. 3 shows a Huffman tree corresponding to another exemplary message consisting of specific ASSCII characters processed in accordance with an embodiment of the present invention.

With the addition of one more new character to the message above and additional copies of an existing character, we get 'ADFBAAABCCAAAABBBCCDDEEE-GAAAA' and the code set given in Table 7 and FIG. 3.

TABLE 7

| Value | Count | Code |
|---|---|---|
| A | 12 | 1 |
| B | 5 | 000 |
| C | 4 | 010 |
| D | 3 | 011 |
| E | 3 | 0010 |
| F | 1 | 00110 |
| G | 1 | 00111 |

Figure 4:
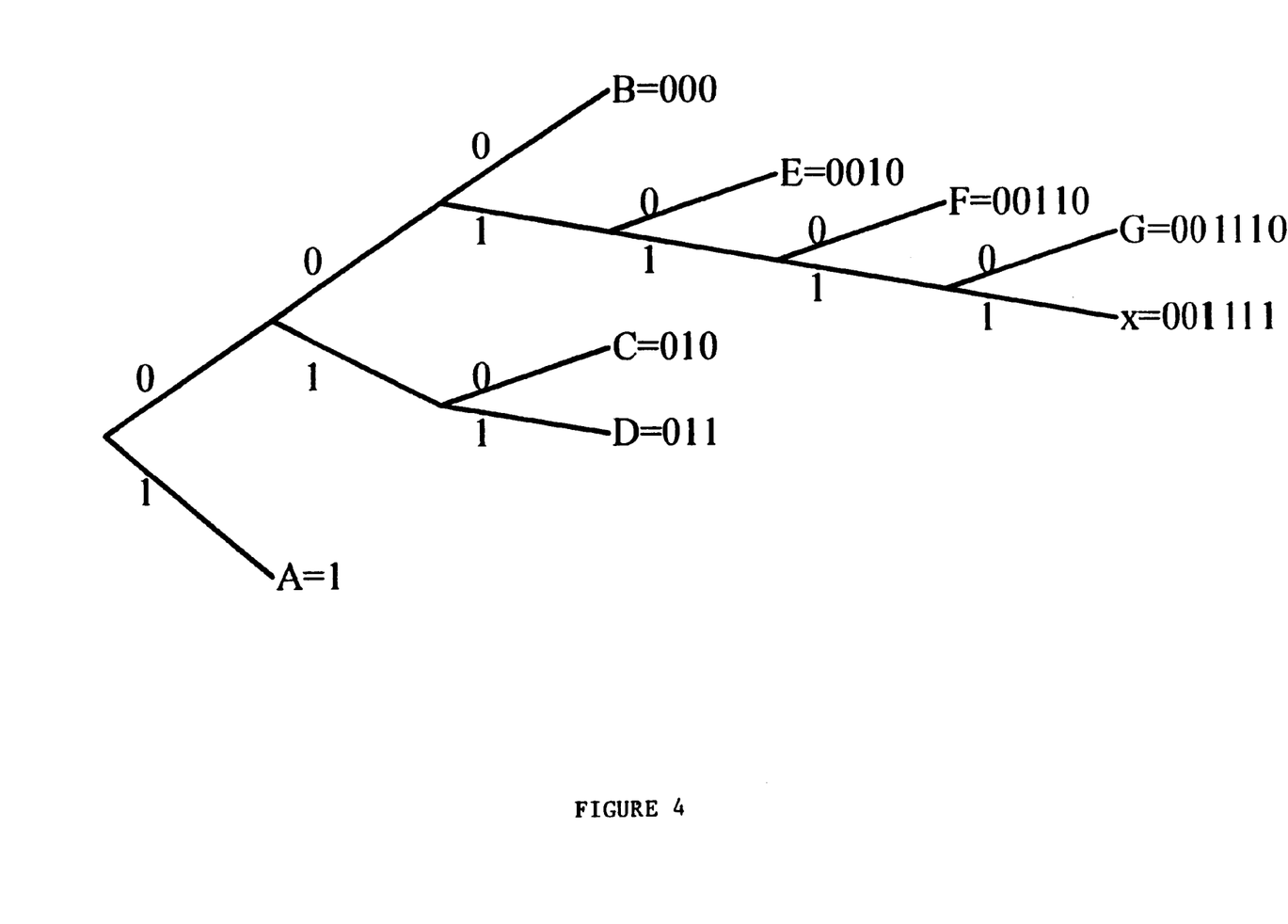
FIG. 4 shows a Huffman tree corresponding to a modified bitstream associated with the exemplary message of FIG. 3 and processed in accordance with an embodiment of the present invention.
Figure 5:
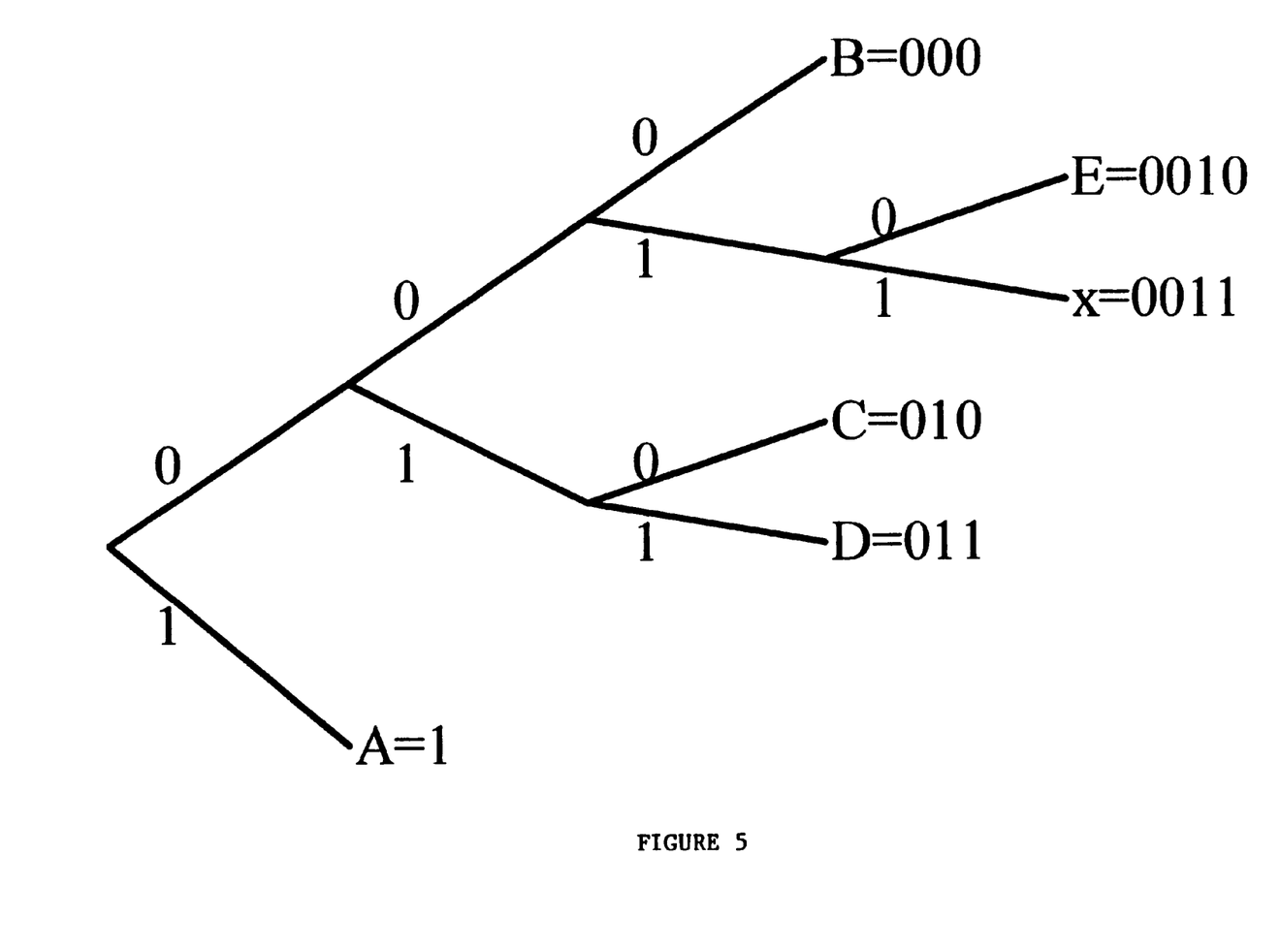
FIG. 5 shows a Huffman tree corresponding to the exemplary message of FIG. 3 as processed in accordance with an embodiment of the present invention.

Now the code length exceeds the arbitrary maximum code length of four. In order to accommodate the required message within a code length of four, the CPU 102 adds a new value, 'x,' that does not represent a specific ASCII character. The 'x' code instead introduces an arbitrary character into the bitstream, in this case the ASCII character for which there is no specific code. Adding 'x' to the tree results in the tree shown in FIG. 4. CPU 102 can then promote 'x' at the expense of other codes which yields the tree shown in FIG. 5. This results in a code set that conforms to the code length requirements, with the provision that the values for 'F' and 'G' must be inserted directly into the bit stream with the 'x' code prefixed. The message now is coded as:

'10110011010001100001110000100101111000000000001-00100110110010001000110 1000111111111' and is decoded initially as follows:

1011→'A',1
0110→'D',3
0011→'x',4 followed by 01000110 which is the ASCII pattern for 'F'
0001→'B',3

It will be readily apparent to those of ordinary skill in the art that the above techniques may be applied in any variety of computing systems and methods. While this invention has been described and illustrated with reference to particular embodiments, the scope of the present invention is not limited to the disclosed embodiments but, on the contrary, is intended to cover numerous other modifications and equivalent arrangements which are included within the spirit and scope of the following claims.

What is claimed is:

1. A system for compressing a stream of characters using a plurality of compression codes of varying length, the system comprising:

means for detecting redundancies of at least two different types in the stream, a first type and a second type;

means for determining the frequency of each of the redundancies detected in the stream;

means for assigning the compression codes in order of length to the redundancies based on the relative frequencies of the redundancies;

means for determining a selected set of the redundancies to use in compressing the stream by:

(a) initially selecting the set of all of the redundancies;

(b) assigning the compression codes in order of length to the selected set of redundancies based on the relative frequencies of the redundancies in the selected set;

(c) assigning a corresponding compression code to each portion of the stream such that when a respective portion of the stream is capable of being represented by a subset of at least one compression code representing a redundancy of the first type and by a subset of at least one compression code of the second type, the shortest subset is used to represent the portion of the stream;

(d) refining the selected set of redundancies to exclude redundancies for which a compression code was not assigned to a portion of the stream in step (c) above; and (e) repeating steps (b) through (d) until a desired threshold has been met; and means for compressing the stream using the final refined selected set of the redundancies.

2. The system of claim 1 wherein the first type of redundancy is based upon repetition of a specific character in the stream and the second type of redundancy is based upon repetition of any substring of a specific length at a specific offset in the stream.

3. A system for compressing a data stream using a plurality of compression codes of varying length comprising:

a processor;

a memory for storing the data stream;

the processor configured to:

(a) retrieve the data stream from the memory and detect redundancies of at least two different types in the stream, a first type and a second type;

(b) determine the frequency of each of the redundancies detected in the stream;

(c) assign the compression codes to the redundancies based on the relative frequencies of the redundancies; and (d) assign a corresponding compression code to each portion of the stream such that when a respective portion of the stream is capable of being represented by at least one compression code representing a redundancy of the first type and by at least one compression code of the second type, the shortest compression code is used to represent the portion of the stream.

4. The system of claim 3 wherein the processor is further configured to:

(e) generate a refined set of redundancies by eliminating redundancies for which a compression code was not assigned to a portion of the stream;

(f) assign the compression codes to the refined set of redundancies based on the relative frequencies of the redundancies in the refined set;

(g) assign a corresponding compression code to each portion of the stream such that when a respective portion of the stream is capable of being represented by at least one compression code representing a redundancy of the first type in the refined set and by at least one compression code of the second type in the refined set, the shortest compression code is used to represent the portion of the stream;

(h) repeating (e), (f), and (g) until a desired threshold has been met; and (i) use the compression codes assigned when the desired threshold has been met to encode the data stream.

5. The system of claim 3 wherein the first type of redundancy is based upon repetition of a specific character in the stream and the second type of redundancy is based upon repetition of any substring of a specific length at a specific offset in the stream.

6. A system for decoding a bitstream containing a plurality of compression codes of varying lengths, the system comprising:

means for sequentially selecting portions of the stream having a number (n) bits in length;

wherein a plurality of the compression codes have a length less than or equal to n and a plurality of the compression codes have a length greater than n;

means for providing a redundant lookup table with a size of at least $2^n$ lookup addresses wherein (i) all addresses prefixed by a value equal to a respective compression code whose length is equal to or less than n contain information for uncompressing the respective compression code; and (ii) all addresses whose value is a prefix to a respective set of compression codes having lengths greater than n contain a reference to a list of information for uncompressing each of the compression codes in the respective set; and means for sequentially using the selected portions of the stream to address the lookup table to decompress the portions of the stream.

7. A system for decoding a bitstream containing a plurality of compression codes of varying lengths associated with a redundant lookup table, the system comprising:

a processor;

a memory for storing the compression codes and the redundant lookup table;

wherein the redundant lookup table has a size of at least $2^n$ lookup addresses wherein all addresses prefixed by a value equal to a respective compression code whose length is equal to or less than n contain information for uncompressing the respective compression code;

the processor configured to:

(a) sequentially select portions of the stream having the number (n) bits in length;

(b) using the selected portion to retrieve the information for uncompressing at least one compression code from the redundant lookup table;

(c) selecting a portion of the stream having n bits in length subsequent to the at least one compression code uncompressed in (b); and (d) repeating (b) and (c) for subsequent portions of the stream until a desired amount of the stream has been uncompressed.

8. The system of claim 7 wherein at least some of the selected portions having n bits in length contain information for uncompressing at least two compression codes with a single lookup.

9. The system of claim 7 wherein a plurality of the compression codes have a length less than or equal to n and a plurality of the compression codes have a length greater than n; and wherein all addresses in the redundant lookup table whose value is a prefix to a respective set of compression codes having lengths greater than n contain a reference to a list of information for uncompressing each of the compression codes in the respective set.

10. The system of claim 7 wherein the redundant lookup table contains compression codes for redundancies of at least two different types in the stream, a first type and a second type; and wherein the processor is configured to use a first type of decompression for redundancies of the first type and a second type of decompression for redundancies of the second type.

11. The system of claim 10 wherein the first type of redundancy is based upon repetition of a specific character in the stream and the second type of redundancy is based upon repetition of any substring of a specific length at a specific offset in the stream; and wherein the processor is configured to insert the respective specific character in response to information retrieved from the redundant lookup table for a compression code of the first type and to copy the repeated substring from the specific offset in the stream in response to information retrieved from the redundant lookup table for a compression code of the second type.

12. A method for decoding a bitstream containing a plurality of compression codes of varying lengths, the method comprising the steps of:

sequentially selecting portions of the stream having a number (n) bits in length;

wherein a plurality of the compression codes have a length less than or equal to n and a plurality of the compression codes have a length greater than n;

providing a redundant lookup table with a size of at least $2_n$ lookup addresses wherein (i) all addresses prefixed by a value equal to a respective compression code whose length is equal to or less than n contain information for uncompressing the respective compression code; and (ii) all addresses whose value is a prefix to a respective set of compression codes having lengths greater than n contain a reference to a list of information for uncompressing each of the compression codes in the respective set; and sequentially using the selected portions of the stream to address the lookup table to decompress the portions of the stream.

13. A method for compressing a data stream using a plurality of compression codes of varying length comprising:

(a) detecting redundancies of at least two different types in the stream, a first type and a second type;

(b) determining the frequency of each of the redundancies detected in the stream;

(c) assigning the compression codes to the redundancies based on the relative frequencies of the redundancies; and (d) assigning a corresponding compression code to each portion of the stream such that when a respective portion of the stream is capable of being represented by at least one compression code representing a redundancy of the first type and by at least one compression code of the second type, the shortest compression code is used to represent the portion of the stream.

14. The method of claim 13 further comprising:

(e) generating a refined set of redundancies by eliminating redundancies for which a compression code was not assigned to a portion of the stream;

(f) assigning the compression codes to the refined set of redundancies based on the relative frequencies of the redundancies in the refined set; and (g) assigning a corresponding compression code to each portion of the stream such that when a respective portion of the stream is capable of being represented by at least one compression code representing a redundancy of the first type in the refined set and by at least one compression code of the second type in the refined set, the shortest compression code is used to represent the portion of the stream.

15. The method of claim 14 further comprising:

(h) excluding redundancies from the refined set for which a compression code was not assigned to a portion of the stream in (g) above; and (i) repeating (f), (g) and (h) until a desired threshold has been met.

16. The method of claim 15 wherein the first type of redundancy is based upon repetition of a specific character in the stream and the second type of redundancy is based upon repetition of any substring of a specific length at a specific offset in the stream.

17. The method of claim 13 wherein the first type of redundancy is based upon repetition of a specific character in the stream and the second type of redundancy is based upon repetition of any substring of a specific length at a specific offset in the stream.

18. The method of claim 17 wherein the specific characters in the stream represent pixels and wherein the substrings represent patterns of graphics data.

19. A method for decoding a bitstream containing a plurality of compression codes of varying lengths, the method comprising:

(a) providing a redundant lookup table with a size of at least 2i lookup addresses wherein all addresses prefixed by a value equal to a respective compression code whose length is equal to or less than n contain information for uncompressing the respective compression code;

(b) sequentially selecting portions of the stream having a number (n) bits in length;

(c) using the selected portion to retrieve the information for uncompressing at least one compression code from the redundant lookup table;

(d) selecting a portion of the stream having n bits in length subsequent to the at least one compression code uncompressed in (c); and (e) repeating (c) and (d) for subsequent portions of the stream until a desired amount of the stream has been uncompressed.

20. The method of claim 19 wherein at least some of the selected portions having n bits in length contain information for uncompressing at least two compression codes with a single lookup.

21. The method of claim 19 wherein the redundant lookup table contains compression codes for redundancies of at least two different types in the stream, a first type and a second type; and wherein a first type of decompression is used for redundancies of the first type and a second type of decompression is used for redundancies of the s econd type.

22. The method of claim 21 wherein the first type of redundancy is based upon repetition of a specific character in the stream and the second type of redundancy is based upon repetition of any substring of a specific length at a specific offset in the stream; and wherein decompressing the first type of compression code comprises inserting the respective specific character in response to information retrieved from the redundant lookup table and decompressing the second type of compression code comprises copying the repeated substring from the specific offset in the stream in response to information retrieved from the redundant lookup table.

* * * * *